United States Patent [19]
Vaz Martins

[11] 3,944,843
[45] Mar. 16, 1976

[54] IMPEDANCE RESPONSIVE TOUCH ACTUATED CIRCUIT

[76] Inventor: Filinto Vaz Martins, rue Coulon 2, 2000 Neuchatel, Switzerland

[22] Filed: Jan. 11, 1974

[21] Appl. No.: 432,603

[30] Foreign Application Priority Data
Mar. 9, 1973 Switzerland.......................... 3472/73

[52] U.S. Cl. ................ 307/116; 200/DIG. 2; 328/5
[51] Int. Cl.² .......................................... H01H 3/12
[58] Field of Search...... 200/DIG. 2, DIG. 1, 159 R; 307/116; 328/5; 84/DIG. 7, DIG. 8; 340/365 C

[56] References Cited
UNITED STATES PATENTS
| | | | |
|---|---|---|---|
| 2,576,929 | 12/1951 | Ercolino | 200/DIG. 2 |
| 2,659,533 | 11/1953 | Quinby et al. | 200/DIG.2 |
| 3,715,540 | 2/1973 | Larson | 200/DIG. 2 |
| 3,737,670 | 6/1973 | Larson | 200/DIG. 2 |

FOREIGN PATENTS OR APPLICATIONS
| | | | |
|---|---|---|---|
| 1,043,710 | 9/1966 | United Kingdom | 307/116 |

OTHER PUBLICATIONS
IBM Technical Disclosure Bulletin, R. A. Johnson, Pushbutton with no moving parts, Apr. 1971, p. 3551.

*Primary Examiner*—Robert K. Schaffer
*Assistant Examiner*—William J. Smith
*Attorney, Agent, or Firm*—Robert E. Burns; Emmanuel J. Lobato; Bruce L. Adams

[57] ABSTRACT

A relay switch for controlling an electronic circuit adapted to adopt two states includes first and second conducting parts spaced apart from one another by an insulating material in a configuration whereby the first and second parts can be connected by a resistance formed by the skin of a user's finger, such connection being effective to control the state of the circuit.

5 Claims, 3 Drawing Figures

IMPEDANCE RESPONSIVE TOUCH ACTUATED CIRCUIT

The invention relates to a device for the control of an electronic circuit designed to adopt two states.

A device according to the invention is characterized by the fact that it includes a first conducting part electrically insulated from a second conducting part, these two parts being adapted to be temporarily connected to control the state of said circuit by an electric resistance formed by the skin of a user.

The accompanying drawings show an embodiment of the invention, by way of example. In the drawings.

The device shown includes a switch formed by two conductive parts or contacts 1 and 2 insulated by a piece of insulating material or insulative spacer material 3.

Part 1 is in the form of a cylindrical ring with a chamfered flange 1A, and is force fitted in a circular aperture of a grounded conducting plate 4.

Figure 1:
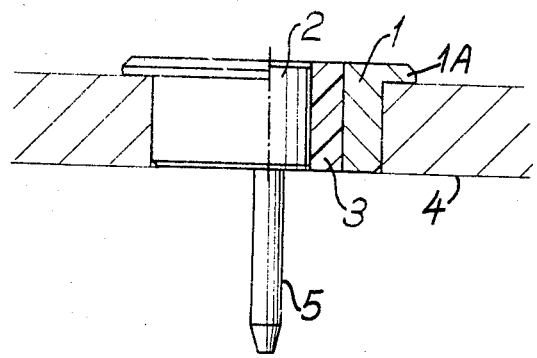
FIG. 1 is an elevational view of the device, partly in cross section.
Figure 2:
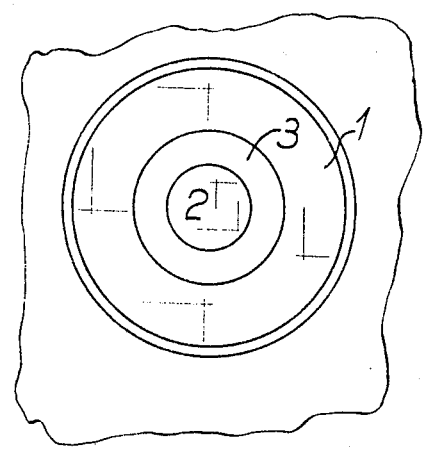
FIG. 2 is a plan view of the device.
Figure 3:
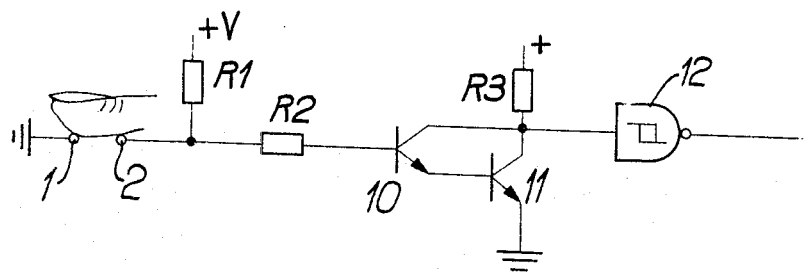
FIG. 3 is a circuit diagram of the device with an associated circuit.

Part 3 is in the form of a cylindrical ring tightly fitted in part 1, and part 2 is a solid cylinder tightly fitted in the bore of part 3. The upper (looking at FIG. 1) faces of parts 1, 2 and 3 are flush and form a smooth surface protruding slightly from the face of plate 4, the dimensions of the switch being such that parts 1 and 2 can be connected by the skin of a user's finger pressed against the upper face of the switch. A stud 5 protruding from the lower (looking at FIG. 1) end face of part 2 enables the switch to be connected to a circuit, as shown in FIG. 3.

This circuit includes a resistor R 1 connecting part 2 to a relay voltage source + V and a resistor R2 connecting part 2 to the base of a transistor 10. The emitter of transistor 10 is connected to the base of a grounded-emitter transistor 11, the collector of transistors 10 and 11 being connected together to voltage source + V via a resistor R3 and to the input of a bistable circuit 12.

In the absence of a connection of parts 1 and 2 by a user's finger, these parts are insulated from one another by a substantially infinite insulating resistance formed by part 3. Part 2, the base and collector of transistor 10 and the collector of transistor 11 are thus all at voltage + V. The transistor 10 conducts and bistable circuit 12 rests in one particular state.

When the parts 1 and 2 are connected by the skin of a user's finger forming a resistance of between about 20 and 100 KΩ, the voltage at part 2 and at the base of transistor 10 drops, and transistors 10 and 11 are blocked and provide a tripping pulse to change the state of bistable circuit 12 which remains in this new state as long as parts 1 and 2 remain connected. As soon as the user removes his finger from the switch, the bistable circuit 12 returns to its original state.

The overall outer diameter of part 1 can, for example, be 1 cm, V 1 can be 5 V, R 1 10MΩ and R2 and R3 each 10 KΩ. When parts 1 and 2 are connected by a user's finger, the voltage applied to the base of transistor 10 drops from 5 V to between about 0.01 to 0.05V.

The described device is particularly useful as a relay for controlling a language laboratory in view of the silent operation due to the absence of any moving parts.

As an alternative, the described bistable circuit 12 could be replaced by one which changes state whenever the parts 1 and 2 are connected and holds the same state even when the parts 1 and 2 are disconnected, until they are connected once again, the device thus acting as a trigger relay.

In another possible modification, the accessible surfaces of parts 1 and 2 instead of being circular could have other shapes: for example part 2 could form a symbol such as a sign or number indicating the function controlled by the particular switch.

What is claimed is:

1. A switching circuit responsive to the impedance of a human hand comprising:
    a transistor having a pair of principal conduction electrodes and a control electrode receptive in use to a current for controlling the conductivity of the transistor;
    means for applying a bias voltage in use to one of said principal conduction electrodes; and
    a voltage divider circuit comprising a pair of resistors electrically connected in series, means electrically connecting one of said resistors to said control electrode, a first conductive contact electrically connected to the junction of said pair of resistors, and a second conductive contact electrically connected to the other of said principal conduction electrodes and bridgeable with a portion of a human hand to introduce the impedance of the portion of the human hand between the junction of said pair of resistors and the other of said principal conduction electrodes and thereby vary the current to said control electrode in use to vary the conductivity of said transistor.

2. A switching circuit according to claim 1, wherein said means for applying a bias voltage in use to one of said principal conduction electrodes comprises a resistor electrically connected to said one of said principal conduction electrodes.

3. A switching circuit according to claim 1, wherein said first and second contacts comprise a pair of conductive concentric cylinders, and further comprising an insulative spacer for positioning said pair of conductive concentric cylinders to be bridgeable with a portion of a human finger.

4. A switching circuit according to claim 1, further comprising a second transistor connected to the first-mentioned transistor to jointly define a Darlington pair therewith.

5. A switching circuit according to claim 1, further comprising a bistable device having an input, and means electrically connecting said one of said principal conduction electrodes to the input of said bistable device.

* * * * *